Sept. 21, 1971 D. J. CRIMMINS 3,606,675

METHOD OF MAKING A KEEPERED WORD-LINE STRUCTURE FOR A THIN MEMORY PACKAGE

Filed Nov. 17, 1969

INVENTOR.
DAVID J. CRIMMINS

BY

Thomas M Marshall
ATTORNEY

United States Patent Office 3,606,675
Patented Sept. 21, 1971

3,606,675

METHOD OF MAKING A KEEPERED WORD-LINE STRUCTURE FOR A THIN MEMORY PACKAGE

David J. Crimmins, Stockton, N.J., assignor to Thomas & Betts Corporation, Elizabeth, N.J.
Filed Nov. 17, 1969, Ser. No. 877,334
Int. Cl. H01f 7/06
U.S. Cl. 29—604 3 Claims

ABSTRACT OF THE DISCLOSURE

Strips of high permeability metal material which is magnetically conductive, but which is non-electrically conductive, are embodied in a one-sided flat conductor cable. Next, location or registration holes are formed precisely located relative to the high permeability metal strips, and then the one-sided cable is laminated to a thin layer of a partially cured epoxy sheet such as pre-preg (of greater length than the one-sided cable), with the magnetic conductors faced down against the pre-preg. A strip of electrically conductive material is laminated to the pre-preg at each end of the one-sided cable, while a sheet of electrically conductive material is laminated to the opposite side of the pre-preg. Using the registration holes as a guide, the electrically conductive strips and the electrically conductive sheet is etched to produce the word-lines and turn-arounds, thereby completing the keepered word-line structure.

In memory packages where thickness is important, specifically where a very thin package is required, a metal keeper is used in lieu of the more commonly used keeper material such as ferrite. The metal keeper is a high permeability material which is highly magnetic-field-conductive, but is non-electrically conductive. In many instances Mu metal, which meets the desired characteristics is utilized in place of the ferrite materials which have to be many times thicker in order to accomplish the same keeper or "flux concentrating" function. In the past, the prior art has employed a sheet of Mu metal on the back of a plurality of word lines, with a layer of insulation being interposed between the word-lines and the Mu metal. However, this has resulted in certain undesirable electrical properties, and hence the prior art advanced to the stage of forming the Mu metal in strips whereby each strip of Mu metal covered one or two word-lines. To accomplish this, the common practice in the art has been to make a laminate comprising copper on one side of a very thin insulation layer, and a sheet of Mu metal on the opposite side of the insulation. In order to form the word-lines and the corresponding keeper lines it was necessary to etch both sides of this laminate. However, because of the different etching characteristics of an electrically conductive sheet and the Mu metal, this step required two separate etching processes; one etching being for the electrically conductive sheet such as copper, and the other etching being required for the etching of the Mu metal. Thus, it is readily realised that this prior art technique gives rise to considerable tolerance problems, besides being very costly and difficult to produce.

Accordingly, it is an object of this invention to provide a simple and economic method of making a keepered word-line structure for a thin memory package.

It is another object of this invention to provide a method of making a keepered word-line structure for a thin memory package, which structure includes discrete conductors of magnetically conductive metal which avoids the second etching step heretofore known in the art, and produces more closely held tolerance.

Briefly, the method comprises the steps of forming a one-sided flat conductor cable, with the conductors being made of a high permeability metal which is magnetically conductive. After registration holes are formed in the one-sided cable, the latter is placed with the metal strips face down, on a very thin sheet of insulation, and strips of electrically conductive material are placed at the ends of the one-sided cable. Additionally, a sheet of electrically conductive material is placed on the opposite side of the insulation. The resulting assembly is laminated together, after which the electrically conductive material is etched to produce the electrical circuitry comprising the word-lines, the bus bars, and turn-arounds, thereby completing the keepered word-line structure.

These and other objects and advantages of the invention will become more apparent from the foregoing detailed description and appended claims, taken in conjunction with the accompanying drawings in which:

Preparatory to the first step of the method of the invention, a wire of high permeability metal which is magnetically conductive, but which is non-electrically conductive, is formed in a suitable configuration for lamination to a continuous strip of dielectric material, such as a plastic film. One metal which is particularly suited for use as a keeper in a keepered word-line structure is Mu metal. The magnetically conductive metal may be rolled flat with a rolling machine in order to produce a substantially rectangular cross-section, or alternatively a sheet of Mu metal may be slit to the required width to form a plurality of strips.

Figure 2:
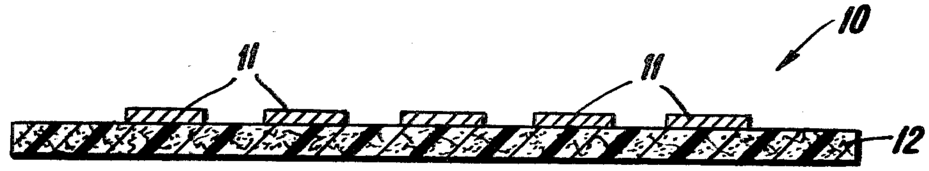
FIG. 2 is a cross-section along lines 2—2 of the one-sided cable illustrated in FIG. 1.
Figure 1:
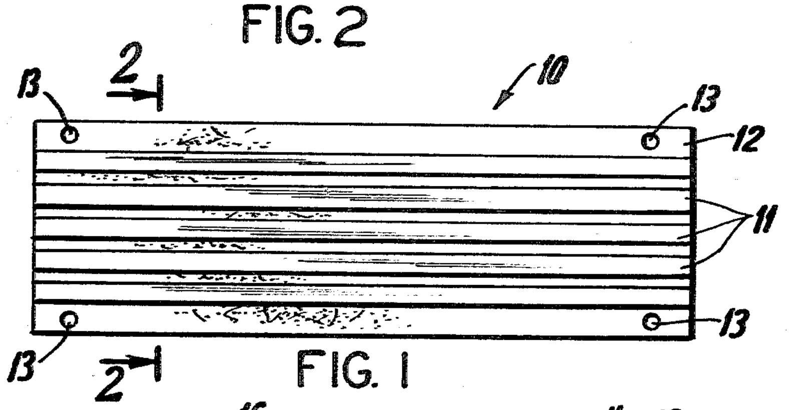
FIG. 1 is a top view of the one-sided flat cable resulting from the first step of the method of the invention.

The first step in the process is to form a one-sided flat cable by bonding a plurality of strips of magnetically conductive metal to a continuous sheet of plastic, using an adhesive, if necessary. This step may be achieved by a conventional lamination process, with the resulting one-sided cable structure 10 (as illustrated in FIGS. 1 and 2) including the magnetically conductive metal strips 11 bonded to the plastic sheet 12. After the one-sided cable 10 has been made and cut to the desired length, registration holes 13 are located precisely with respect to the magnetically conductive metal strips.

Figure 3:
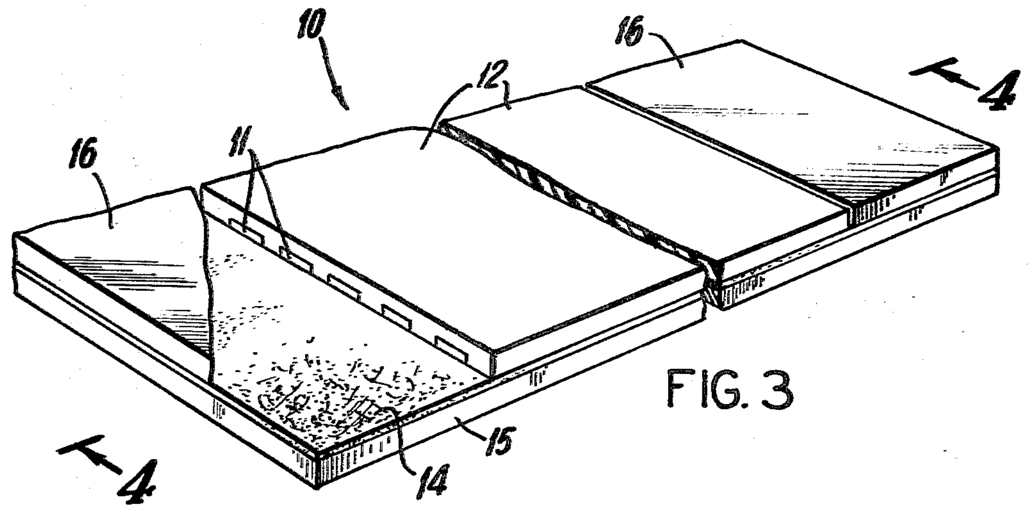
FIG. 3 is a perspective view, partially in section, of the magnetically conductive metal keepered word-line structure made by the method of the present invention prior to etching of the conductive material.

Turning to FIG. 3 the next step in the process is to prepare a raw material lay-out for producing a laminate, comprising a very thin insulation layer 14 having on one side a sheet of electrically conductive material 15, such as copper. Disposed on the opposite side of the thin insulation layer 14 is the one-sided cable 10 with the magnetically conductive metal strips 11 facing the insulation layer 14, along with two pieces of electrically conductive material 16, 16, also preferably copper, which are placed at opposite ends of the one-sided cable 10.

Insulation layer 14 may comprise a partially cured epoxy material, commonly referred to as pre-preg, or may be made of an epoxy-wetted fiberglass cloth. It is preferable to use pre-preg board because this avoids the step of curing the epoxy-wetted glass cloth. In either case, the insulation layer 14 is very thin, and preferably on the order of $\frac{1}{1000}$ of an inch.

The electrically conductive elements 16, 16 are included in the assembly to provide the required electrical turn-arounds for connection to plated-through holes, and in order to provide the necessary circuitry for connection to adjacent systems.

Figure 4:
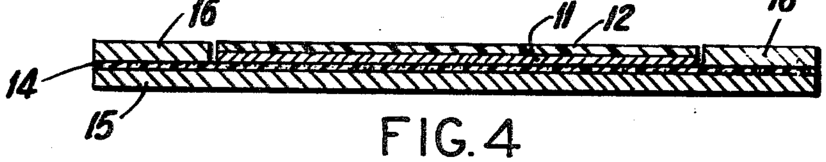
FIG. 4 is a cross-sectional view taken along line 4—4 of FIG. 3.

The resulting lay-up illustrated in FIGS. 3 and 4 is then laminated to form a unitary structure.

The next step in the process is to locate the art work for the word-lines, the turn-arounds, and the electrical conductors on the back side of the keepered word-line structure with respect to the registration holes 13. The electrically conductive material is then formed into the required circuitry using a standard technique such as a photo-resist etching process.

Figure 5:
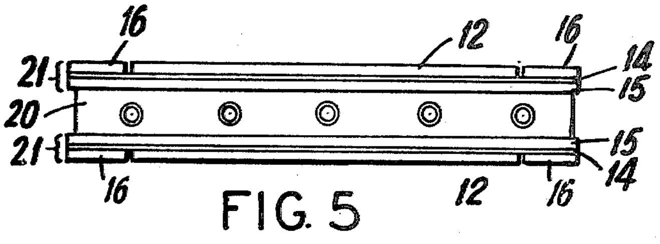
FIG. 5 is a partial cross-section of a very thin memory package including a keepered word-line structure made according to the method of the present invention.

The resulting keepered word-line structure may then be embodied in a thin memory package. As illustrated in FIG. 5, a thin memory package is formed by a tunnel structure 20 (for example, as described in Patent No. 3,465,432) sandwiched between two keepered word-line structures 21 made according to the method of the invention. As clearly indicated in FIG. 5, the word-lines (etched out of the copper sheet 15) are disposed in close proximity to the tunnel structure 20, whereas the metal keeper 20 is disposed on the outermost surfaces of the memory package in order to perform their "flux concentration" function.

The advantage of the method of the present invention is that it eliminates one of the etching processes previously required in the prior art techniques, and produces a keepered word-line structure which is more accurate in the sense that the magnetically conductive metal keeper is more accurately positioned with respect to the word lines.

While this invention has been described in relation to the specific example, it will be appreciated that modifications can be made in the various steps to adapt it for other specific end uses without departing from the scope and spirit of the invention. As an example, it is readily apparent that the two additional pieces of electrically conductive material 16, 16 may be omitted from the assembly prior to lamination and etching. In such case, after etching of the word-lines, a bus bar or the like may be bonded to the keepered word-line structure and plated-through holes may be formed in order to provide the necessary circuitry for embodiment in a thin memory package.

What is claimed is:

1. A method of making a metal keepered word-line structure for a thin memory package comprising the steps of:

forming a one-sided flat cable by bonding a plurality of magnetically conductive, but non-electrically conductive metal strips to a strip of insulation;

precisely locating registration holes in the flat cable with respect to the magnetically conductive metal strips;

placing the one-sided cable, with the magnetically conductive strips face down, on one side of a second strip of insulation;

placing a sheet of electrically conductive material on the opposite side of said second strip of insulation;

laminating the assembly of the preceding steps to form a unitary structure; and forming word lines by removing portions of the sheet of the electrically conductive material with reference to the registration holes in the flat cable.

2. The method of making a metal keepered word-line structure for a thin memory package comprising the steps of:

forming an elongated one-sided flat cable by bonding a plurality of magnetically conductive, but non-electrically conductive metal strips to a strip of insulation;

precisely locating registration holes in the flat cable with respect to the magnetically conductive metal strip;

placing the one-sided cable, with the magnetically conductive strips face down, on the first side of a second strip of insulation;

placing a sheet of electrically conductive material on the opposite side of said second strip of insulation;

placing a strip of electrically conductive material on said first side of said second strip of insulation adjacent the ends of the elongated flat cable;

laminating the assembly of the preceding steps to form a unitary structure; and forming electrical circuitry by removing portions of the electrically conductive material disposed on both sides of the second insulation strip, which circuitry is precisely located with reference to the registration holes in the flat cable.

3. A method of making a metal keepered word-line structure for use in a thin memory package comprising the steps of:

making an uninsulated flat cable having discrete metal strips of magnetically-conductive, but non-electrically conductive, material adhered to a carrier strip of insulation material;

precisely locating registration holes in said uninsulated flat cable with respect to at least one of said metal strips;

preparing a raw material lay-up by positioning the metal strips of said flat cable in contact with one side of a second strip of insulation material and placing a sheet of electrically conductive material on the opposite side of said second strip of insulation, and positioning additional electrically conductive material adjacent the ends of said flat cable;

laminating the raw material lay-up of the previous step to produce a dimensionally stable laminate;

preparing said laminate for photo resist and etching of the electrically conductive material by locating the art work relative to said registration holes; and etching the laminate to produce the desired word-lines and electrical circuitry.

References Cited

"Fabrication of Plated Stripline and Keeper," J. J. McNichol, IBM Technical Disclosure Bulletin; February 1966, pp. 1278–1279.

JOHN F. CAMPBELL, Primary Examiner

C. E. HALL, Assistant Examiner

U.S. Cl. X.R.

340—174BC, 174PW, 174TF